(12) United States Patent
Ogata

(10) Patent No.: US 7,179,687 B2
(45) Date of Patent: Feb. 20, 2007

(54) SEMICONDUCTOR DEVICE AND ITS MANUFACTURING METHOD, AND SEMICONDUCTOR DEVICE MANUFACTURING SYSTEM

(75) Inventor: Yoshiharu Ogata, Sakata (JP)

(73) Assignee: Seiko Epson Corporation (JP)

( * ) Notice: Subject to any disclaimer, the term of this patent is extended or adjusted under 35 U.S.C. 154(b) by 35 days.

(21) Appl. No.: 10/973,991

(22) Filed: Oct. 26, 2004

(65) Prior Publication Data
US 2005/0112803 A1    May 26, 2005

(30) Foreign Application Priority Data
Oct. 27, 2003    (JP) .................... 2003-366081

(51) Int. Cl.
*H01L 21/44* (2006.01)
(52) U.S. Cl. .................... 438/118; 438/106; 438/108; 438/612; 257/E21.519
(58) Field of Classification Search .................... None
See application file for complete search history.

(56) References Cited

U.S. PATENT DOCUMENTS

2003/0052419 A1*  3/2003  Ujiie et al. ............. 257/787

2004/0235221 A1* 11/2004  Taguchi et al. ............. 438/108

FOREIGN PATENT DOCUMENTS

| JP | 04-171950 | 6/1992 |
|---|---|---|
| JP | 06-151509 | 5/1994 |
| JP | 2000-164610 | 6/2000 |
| JP | 2000-174039 | 6/2000 |
| JP | 2001-127105 | 5/2001 |

OTHER PUBLICATIONS

Communication from Japanese Patent Office regarding counterpart application.
Communication from Japanese Patent Office regarding related application.

* cited by examiner

*Primary Examiner*—Michael Lebentritt
*Assistant Examiner*—Cheung Lee
(74) *Attorney, Agent, or Firm*—Harness, Dickey & Pierce, P.L.C.

(57) ABSTRACT

A method of manufacturing a semiconductor device is provided including depressing a bonding tool having a concave portion toward a wiring board with a semiconductor chip disposed within the concave portion, pressing the semiconductor chip with a bottom face of the concave portion, fluidizing a resin provided between the semiconductor chip and the wiring board, and filling a lateral space proximate the semiconductor chip within the concave portion with the resin, and curing the resin.

6 Claims, 4 Drawing Sheets

SEMICONDUCTOR DEVICE AND ITS MANUFACTURING METHOD, AND SEMICONDUCTOR DEVICE MANUFACTURING SYSTEM

RELATED APPLICATIONS

This application claims priority to Japanese Patent Application No. 2003-366081 filed Oct. 27, 2003.

BACKGROUND

1. Technical Field

The present invention relates to a semiconductor device and its manufacturing method, and a system of manufacturing the semiconductor device.

2. Related Art

There has been known a method of fixing a semiconductor chip on a wiring board with a resin. When the resin is formed so as to expand to a side of the semiconductor chip, the reliability of the semiconductor device can be enhanced. In this case, if the size of the resin disposed on the side of the semiconductor chip can be controlled, the following are possible to form a semiconductor device of a given size formed and to manufacture a semiconductor device with high mountability.

An object of the invention is to provide a semiconductor device with high reliability and mountability and its manufacturing method, and a manufacturing system of such semiconductor device.

SUMMARY

A method of manufacturing a semiconductor device according to the invention includes the steps of: depressing a bonding tool having a concave portion toward a wiring board with a semiconductor chip disposed within the concave portion, pressing the semiconductor chip with a bottom face of the concave portion, fluidizing a resin provided between the semiconductor chip and the wiring board, and filling a lateral space proximate the semiconductor chip within the concave portion with the resin; and curing the resin. According to the invention, a resin portion is formed so as to expand to a level beside the semiconductor chip. Thus, the semiconductor chip can be fixed on the wiring board firmly. Also, according to the invention, the shape of the resin portion can be controlled by the concave portion of the bonding tool. Therefore, a semiconductor device having a size as has been designed can be manufactured. In other words, according to the invention, a semiconductor device superior in reliability and mountability can be manufactured.

In the method of manufacturing a semiconductor device, a surrounding portion of the concave portion of the bonding tool may be kept out of contact with the wiring board. This allows the resin to be discharged outside the concave portion of the bonding tool and as such, a semiconductor having a size as has been designed can be manufactured even when the resin is excessively provided.

In the method of manufacturing a semiconductor device, the bonding tool may have a protruding portion formed in the bottom face of the concave portion, and the semiconductor chip may be pressed with a protruding face of the protruding portion to thereby fill lateral spaces of the semiconductor chip and the protruding portion within the concave portion with the resin.

In the method of manufacturing a semiconductor device, the step of fluidizing the resin may be carried out while the resin is heated. This allows the concave portion of the bonding tool to be easily filled with the resin, and therefore the production efficiency of the semiconductor device can be increased.

In the method of manufacturing a semiconductor device, the resin may be a heat-hardening resin.

In the method of manufacturing a semiconductor device, a sheet for preventing adhesion of the resin may be interposed between the bonding tool and the semiconductor chip and the resin. This makes it possible to prevent the resin from adhering to the bonding tool and as such, one bonding tool can be continuously utilized and thus the production efficiency of the semiconductor device can be increased.

In the method of manufacturing a semiconductor device, the step of curing the resin may be carried out with the bonding tool depressed. This enables the contour of the resin portion to be formed as has been designed and as such, a semiconductor device superior in reliability and mountability can be manufactured.

A semiconductor device according to the invention is manufactured by any one of the above-described methods.

A semiconductor device manufacturing system includes a bonding tool having a concave portion; and an actuator for moving the bonding tool up and down, wherein the actuator depresses the bonding tool toward a wiring board with a semiconductor chip disposed within the concave portion, presses the semiconductor chip with a bottom face of the concave portion, fluidizes a resin provided between the semiconductor chip and the wiring board, and fills a lateral space proximate the semiconductor chip within the concave portion with the resin. According to the invention, a resin portion may be formed so as to expand to a level beside the semiconductor chip. Thus, the semiconductor chip can be fixed on the wiring board firmly. Also, according to the invention, the shape of the resin portion can be controlled by the concave portion of the bonding tool. Therefore, a semiconductor device having a size as has been designed can be manufactured. In other words, according to the invention, a semiconductor device superior in reliability and mountability can be manufactured.

In the semiconductor device manufacturing system, the actuator may drive the bonding tool so that the surrounding portion of the concave portion is kept out of contact with the wiring board. This allows the resin to be discharged outside the concave portion of the bonding tool and as such, a semiconductor having a size as has been designed can be manufactured even when the resin is excessively provided.

In the semiconductor device manufacturing system, the bonding tool may have a protruding portion formed in the bottom face of the concave portion, and the semiconductor chip may be pressed with a protruding face of the protruding portion to thereby fill lateral spaces of the semiconductor chip and the protruding portion within the concave portion with the resin.

The semiconductor device manufacturing system may further include a heater.

The semiconductor device manufacturing system may further include a sheet interposed between the bonding tool and the semiconductor chip and the resin for preventing adhesion of the resin. This enables one bonding tool to be continuously utilized and as such, the production efficiency of the semiconductor device can be increased.

DETAILED DESCRIPTION

Figure 1:
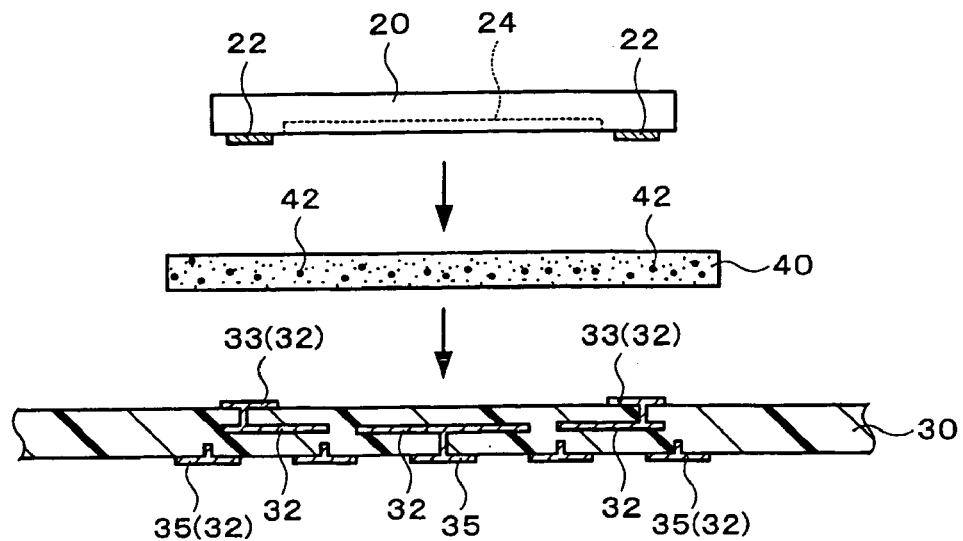
FIG. 1 is a view of a method of manufacturing a semiconductor device according to an embodiment of the invention.

Embodiments of the invention will be described below in reference to the drawings. However, the invention is not limited to the following embodiments.

FIGS. 1–6 are views of a method of manufacturing a semiconductor device according to an embodiment of the invention. The method of manufacturing a semiconductor device according to the embodiment includes depressing the bonding tool 10 having a concave portion 12 toward the wiring board 30 with a semiconductor chip 20 disposed within the concave portion 12, pressing the semiconductor chip 20 with the bottom face 14 of the concave portion 12, fluidizing a resin 40 provided between the semiconductor chip 20 and the wiring board 30, and filling a lateral space proximate the semiconductor chip 20 within the concave portion 12 with the resin 40 (see FIG. 4). The steps will be described below.

The method may include preparing the wiring board 30 (see FIG. 1). The material for the wiring board 30 is not particularly limited, and the wiring board may be formed from an organic board (e.g. an epoxy board), an inorganic board (e.g. a ceramic board, a glass board), or their composite structures (e.g. a glass-epoxy board). The wiring board 30 may be a rigid board. In this case, the wiring board 30 may be referred to as an interposer. Alternatively, the wiring board 30 may be a flexible board, such as a polyester board or a polyimide board. Also, the wiring board 30 may be a board for a COF (Chip On Film). The wiring board 30 may be a single-layer board composed of a single layer, or a laminated board having a plurality of stacked layers. Also, the wiring board 30 is not particularly limited in its shape and thickness.

The wiring board 30 has a metallization pattern 32 (see FIG. 1). The metallization pattern 32 may be formed by stacking one or more layers of copper (Cu), chromium (Cr), titanium (Ti), nickel (Ni), titanium-tungsten (Ti—W), gold (Au), aluminum (Al), nickel vanadium (NiV), and tungsten (W), or may be formed by any one of the layers. The metallization pattern 32 may be formed so as to electrically connect one face of the wiring board 30 with the other face thereof. For example, the metallization pattern 32 may have pads 33 and 35 as shown in FIG. 1. In this case, the pad 33 is provided on the one face of the wiring board 30, and the pad 35 is provided on the other face of the wiring board 30. The electrical connection between the two faces of the wiring board 30 may be ensured by electrically connecting the pads 33 and 35. In this case, the metallization pattern inclusive of the pads 33 and 35 may be referred to as the metallization pattern 32. When a laminated board is prepared as the wiring board 30, the metallization pattern 32 may be provided between the layers thereof. The method of forming the metallization pattern 32 is not particularly limited. For example, the metallization pattern 32 may be formed by sputtering or the like and an additive process in which the metallization pattern 32 is formed by electroless plating may be applied. The metallization pattern 32 may be produced by plating with solder, tin, gold, nickel, or the like.

The method may include providing a resin 40 on the wiring board 30 (see FIG. 1). The resin 40 may be provided in a film form, or in a paste form. The material of the resin 40 is not particularly limited. As shown in FIG. 1, an anisotropically conductive film (ACF) containing electroconductive particles 42 may be utilized as the resin 40. However, instead of this, an anisotropically conductive paste (ACP) containing electroconductive particles or a resin containing no electroconductive particles (e.g. NCF or NCP) may be utilized (not shown).

The method may include mounting the semiconductor chip 20 on the wiring board 30 (see FIG. 1). In this case, the semiconductor chip 20 may be mounted with the resin 40. The semiconductor chip 20 has electrodes 22. The electrodes 22 may be electrically connected with inside portions of the semiconductor chip 20. The semiconductor chip 20 may have an integrated circuit 24 composed of a transistor, a memory element, or the like, and the electrodes 22 may be electrically connected with the integrated circuit 24. The semiconductor chip 20 may be mounted so that the electrodes 22 are opposed to the wiring board 30 (pads 33) as shown in FIG. 1.

Figure 2:
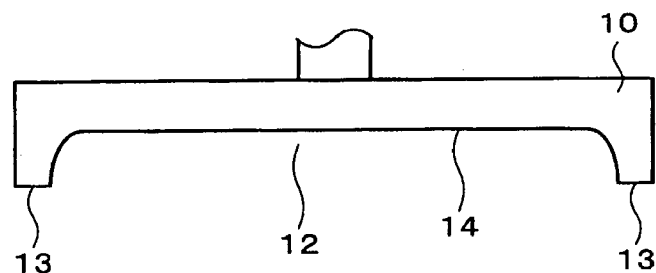
FIG. 2 is a view of the method of manufacturing a semiconductor device according to the embodiment of the invention.
Figure 3:
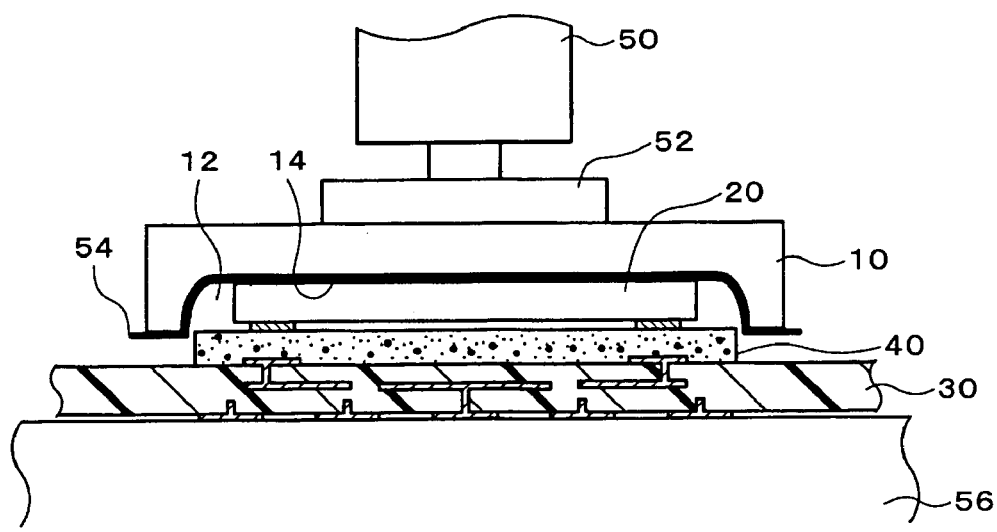
FIG. 3 is a view of the method of manufacturing a semiconductor device according to the embodiment of the invention.
Figure 4:
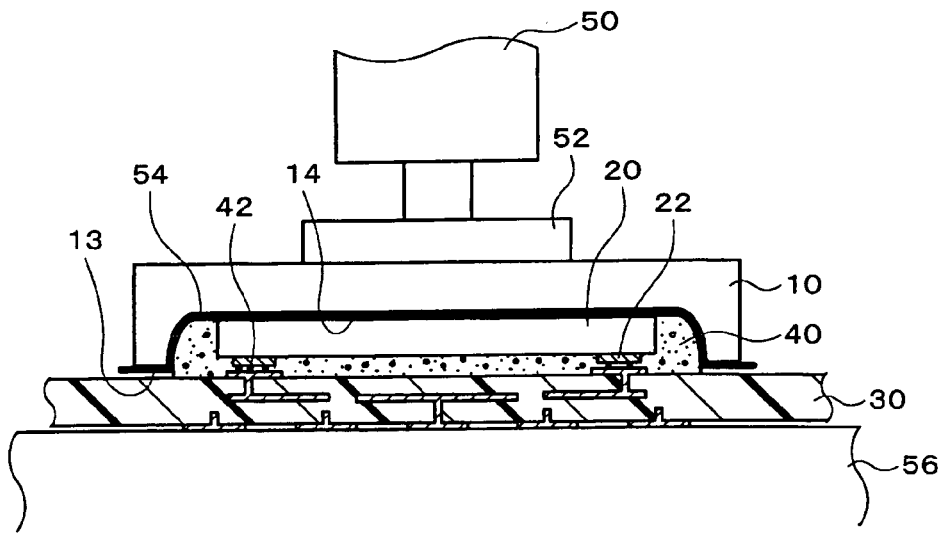
FIG. 4 is a view of the method of manufacturing a semiconductor device according to the embodiment of the invention.

The method may include preparing a bonding tool 10 having a concave portion 12 as shown in FIG. 2. The method may include positioning the bonding tool 10 so that the semiconductor chip 20 is disposed within the concave portion 12 as shown in FIG. 3. Then, with the semiconductor chip 20 disposed within the concave portion 12, the bonding tool 10 is depressed toward the wiring board 30. Further, the semiconductor chip 20 is pressed with the bottom face 14 of the concave portion 12 of the bonding tool 10 to thereby fluidize the resin 40 provided between the semiconductor chip 20 and the wiring board 30. Next, as shown in FIG. 4, a lateral space proximate the semiconductor chip 20 within the concave portion 12 is filled with the resin 40. More specifically, the resin 40 is pressed from the semiconductor chip 20 to be spread outwardly, while the spread of the resin is restricted by the concave portion 12 of the bonding tool 10 and therefore the concave portion 12 is filled with the resin. Thus, the lateral space proximate the semiconductor chip 20 within the concave portion 12 is filled with the resin 40. The bonding tool 10 may be driven by an actuator 50.

The method may be performed while the resin 40 is heated. In general, a resin is enhanced in its fluidity with an increase in temperature. Therefore, performing the method while heating the resin 40 makes the resin 40 easy to fluidize, which facilitates filling the lateral space proximate the semiconductor chip 20 within the concave portion 12 with the resin 40. As a result, the production efficiency of the semiconductor device can be increased. The resin 40 may be heated by a heater. As shown in FIGS. 3 and 4, the bonding tool 10 may be heated by the heater 52, to thereby heat the resin 40 indirectly. In addition to this, the resin 40 may be heated directly.

In the steps shown in FIGS. 3 and 4, a sheet 54 may be interposed between the bonding tool 10 and the semiconductor chip 20 and the resin 40. The sheet 54 has the function of preventing the attachment of the resin 40. The sheet 54 can prevent the resin 40 from adhering to the bonding tool 10. Thus, it becomes possible to continuously manufacture semiconductor devices with one bonding tool 10, whereby the production efficiency of semiconductor devices can be increased. Incidentally, a sheet formed from e.g. Teflon (registered trademark) may be utilized as the sheet 54.

In the steps shown in FIGS. 3 and 4, the entire face of the semiconductor chip 20 which is opposed to the bonding tool 10 may be in contact with the bottom face 14 of the concave portion 12 (or sheet 54). This can prevent the resin 40 from adhering to the top face of the semiconductor chip 20. Therefore, it is possible to control the height of a wiring apparatus and to keep defects of exterior appearance to a minimum.

In the step shown in FIG. 4, the surrounding portion 13 of the concave portion 12 of the bonding tool 10 may be kept out of contact with the wiring board 30. This allows the resin 40 to be discharged outside the concave portion 12 of the bonding tool 10 even when the resin 40 is excessively provided. As a result, the need to strictly control the amount of the resin 40 is eliminated, and therefore a semiconductor device can be manufactured efficiently.

In the method, the electrodes 22 of the semiconductor chip 20 may be opposed to and electrically connected with the metallization pattern 32 (pads 33) (see FIG. 4). In this case, the electrodes 22 and pads 33 may be electrically connected with each other with electroconductive particles 42 interposed therebetween. Further, the process may be carried out in the condition where the wiring board 30 is set on the supporting base 56 as shown in FIGS. 3 and 4.

Figure 5:
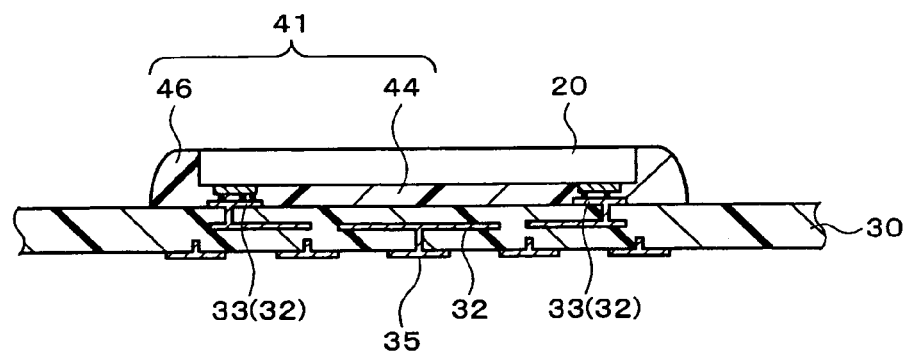
FIG. 5 is a view of the method of manufacturing a semiconductor device according to the embodiment of the invention.

The method of manufacturing a semiconductor device according to the embodiment preferably includes curing the resin 40. As shown in FIG. 5, the resin 40 may be cured to form the resin portion 41. The resin portion 41 allows the semiconductor chip 20 to be fixed to the wiring board 30. By the method of manufacturing a semiconductor device according to the embodiment, the resin portion 41 is shaped into a form such that it has a first portion 44 overlapping with the semiconductor chip 20 and a second portion 46 disposed around the semiconductor chip 20, as shown in FIG. 4. This allows the semiconductor chip 20 to be firmly fixed to the wiring board 30 and therefore it becomes possible to manufacture semiconductor devices with high reliability. The step of curing the resin 40 may be carried out in the condition where the bonding tool 10 is depressed (see FIG. 4). Thus, the resin portion 41 can be shaped so as to fit snugly against the contour of the concave portion 12 of the bonding tool 10. In other words, by pre-selecting the shape of the concave portion 12 of the bonding tool 10, the resin portion 41 can be shaped into a designed form. Hence, the bonding strength of the wiring board 30 and the semiconductor chip 20 can be maintained, and the resin portion 41 of a smallest contour can be formed. That is, it is possible to manufacture a semiconductor device superior in reliability and mountability. The method of curing the resin 40 is not particularly limited, and a method adapted to the characteristics of the resin 40 may be selected. For example, the resin 40 may be a heat-hardening resin. In this case, the resin 40 may be cured by heating. In general, a resin is enhanced in its fluidity when it is heated as described above. Therefore, in the case of a heat-hardening resin utilized as the resin 40, heating the resin 40 in the step of pressing the semiconductor chip 20 and afterward allows not only the concave portion 12 of the bonding tool 10 to be filled with the resin 40 easily, but also the resin 40 to be easily cured thereafter, and therefore a semiconductor device can be manufactured efficiently.

Figure 6:
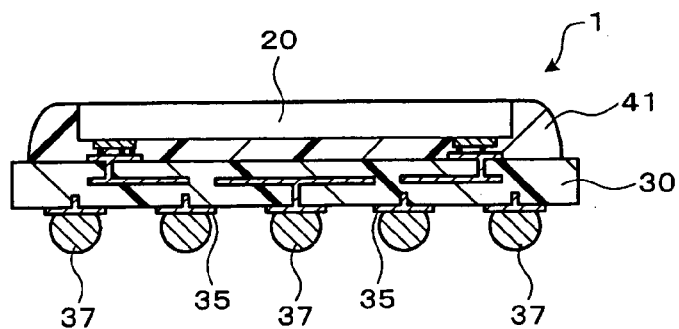
FIG. 6 is a view of the method of manufacturing a semiconductor device according to the embodiment of the invention.
Figure 7:
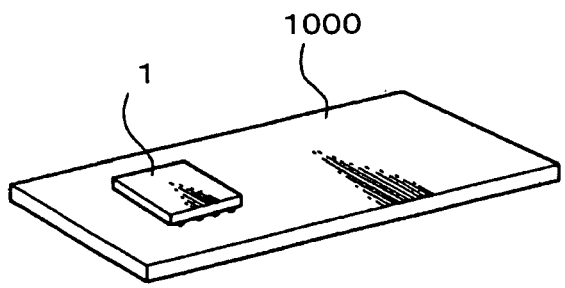
FIG. 7 is a view showing a circuit board having the semiconductor device mounted thereon, wherein the semiconductor device is associated with the embodiment of the invention.
Figure 8:
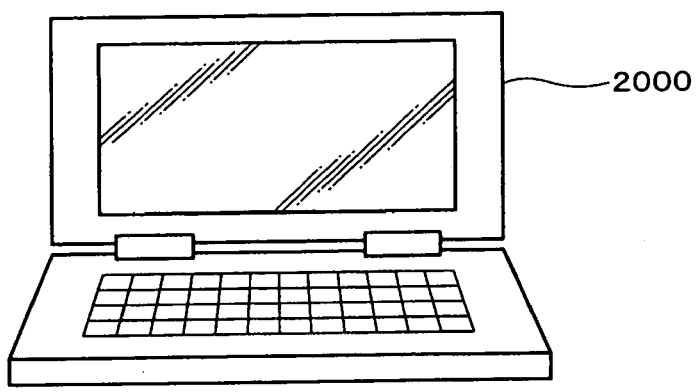
FIG. 8 is a view showing an electronic unit having the semiconductor device according to the embodiment of the invention.
Figure 9:
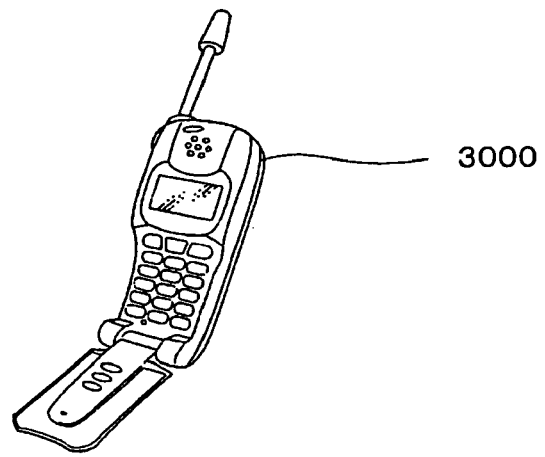
FIG. 9 is a view showing an electronic unit having the semiconductor device according to the embodiment of the invention.

Lastly, the semiconductor device may be manufactured through the step of providing external terminals 37 on the pads 35, the step of inspection, the step of cutting and carving the wiring board 30. In FIG. 6, there is shown a semiconductor device 1 manufactured by the method of manufacturing a semiconductor device according to the embodiment. In FIG. 7, there is shown a wiring board 1000 having the semiconductor device 1 mounted thereon. As electronic units, each having a semiconductor device manufactured by the method of manufacturing a semiconductor device according to the embodiment of the invention, FIGS. 8 and 9 show a notebook-sized personal computer 2000 and a cellular phone respectively.

The above-described manufacturing steps of a semiconductor device may be carried out utilizing a semiconductor device manufacturing system including the bonding tool 10 with the concave portion 12. The semiconductor device manufacturing system includes an actuator 50 for moving the bonding tool 10 up and down. The actuator 50 may drive the bonding tool 10 so as to keep the surrounding portion 13 of the concave portion 12 out of contact with the wiring board 30. The semiconductor device manufacturing system may include a heater 52. The heater 52 may heat the resin 40. While the heater 52 may directly heat the resin 40, it may also indirectly heat the resin 40, for example, by heating the bonding tool 10 (see FIGS. 3 and 4). The semiconductor device manufacturing system may further include a sheet 54. The sheet 54 is interposed between the bonding tool 10 and the semiconductor chip 20 and the resin 40. The sheet 54 has the function of preventing the attachment of the resin 40. In addition, the semiconductor device manufacturing system may further include a supporting base 56. By utilizing such a semiconductor device manufacturing system, it becomes possible to manufacture a semiconductor device superior in reliability and mountability.

Figure 10:
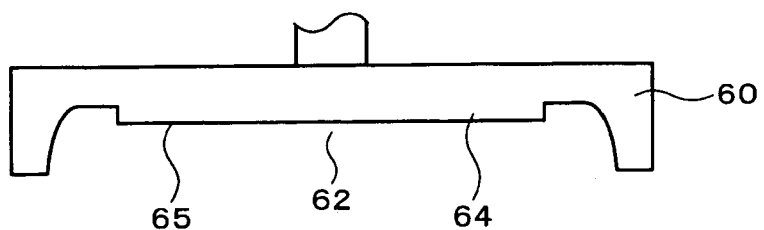
FIG. 10 is a view of a method of manufacturing a semiconductor device according to an alternative of the embodiment of the invention.
Figure 11:
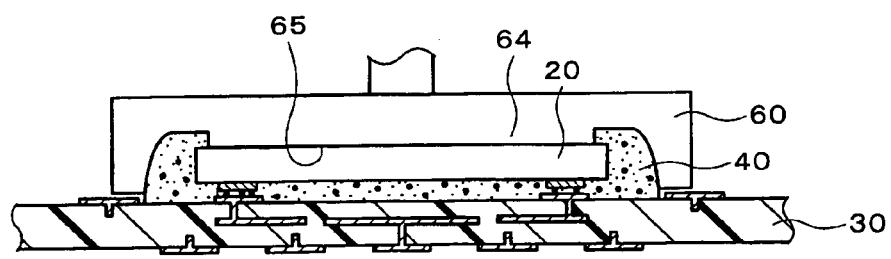
FIG. 11 is a view of the method of manufacturing a semiconductor device according to the alternative of the embodiment of the invention.
Figure 12:
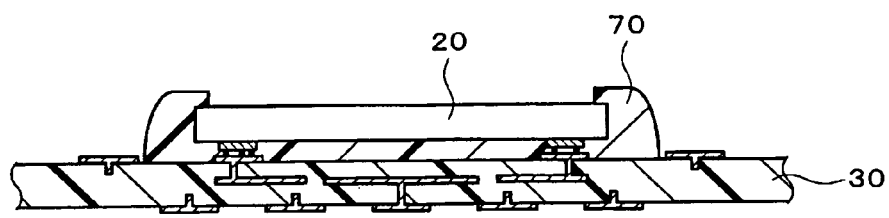
FIG. 12 is a view of the method of manufacturing a semiconductor device according to the alternative of the embodiment of the invention.
Figure 13:
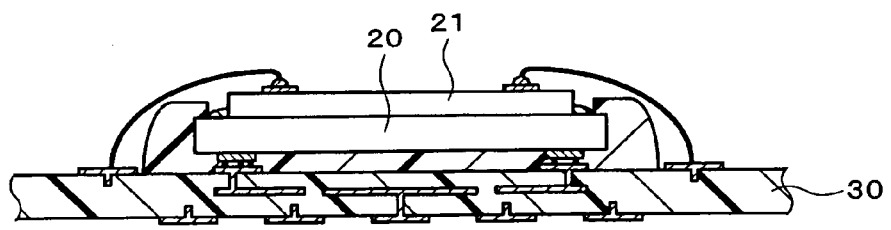
FIG. 13 is a view of the method of manufacturing a semiconductor device according to the alternative of the embodiment of the invention.

A method of manufacturing a semiconductor device according to an embodiment of the invention is not limited to the foregoing, and various alternatives are possible. For example, as shown in FIG. 10, the method of manufacturing a semiconductor device may include preparing a bonding tool 60. The bonding tool 60 has a concave portion 62. Also, the bonding tool 60 has a protruding portion 64 formed in the bottom face of the concave portion 62. The method of manufacturing a semiconductor device includes depressing the bonding tool 60 with the semiconductor chip 20 disposed within the concave portion 62 and pressing the semiconductor chip 20 with the protruding face 65 of the protruding portion 64. Then, as shown in FIG. 11, the lateral spaces proximate the semiconductor chip 20 and the protruding portion 64 within the concave portion 62 are filled with the resin 40. The method of manufacturing a semiconductor device preferably includes curing the resin 40 to form a resin portion 70 as shown in FIG. 12. By the method of manufacturing a semiconductor device according to the alternative, the resin portion 70 is formed so as to expand to a level higher than the face opposite the face of the semiconductor chip 20 opposed to the wiring board 30. Thus, for example, in the case where an adhesive is provided on the semiconductor chip 20, sagging of the adhesive can be prevented. In other words, it is possible to manufacture a semiconductor device suitable for a laminated structure. For example, as shown in FIG. 13, a laminate-type semiconductor device may be manufactured by mounting a semiconductor chip 21 on the semiconductor chip 20. Here, the protruding face 65 may be smaller than the two-dimensional shape of the semiconductor chip 20, as shown in FIG. 11. According to this, the resin portion 70 is formed so as to expand to a level reaching a peripheral portion of the face opposite the face of the semiconductor chip 20 opposed to the wiring board 30, as shown in FIG. 12. Therefore, the semiconductor chip 20 and the wiring board 30 can be bonded more firmly, and a semiconductor device with high reliability can be manufactured. In addition to this, the protruding face may be larger than the two-dimensional shape of the semiconductor chip 20 (not shown).

The invention is not limited to the above-described embodiments, and various modifications and changes may be made. For example, the invention may include an arrangement substantially identical to the arrangement described in any one of the embodiments (e.g. an arrangement identical in its function, method, and result, or an arrangement identical in its object and effect). Also, the invention may include an arrangement wherein a nonessential part of the arrangement described in any one of the embodiments is replaced with another part. Further, the invention may include an arrangement which can produce the same effect and advantage as the arrangement described in any one of the embodiments can do or an arrangement which can achieve the same object. Still further, the invention may include an arrangement obtained by adding the well-known art to the arrangement which has been described in any one of the embodiments.

What is claimed is:

1. A method of manufacturing a semiconductor device, comprising the steps of:
    depressing a bonding tool having a concave portion toward a wiring board with a semiconductor chip disposed within the concave portion;
    pressing the semiconductor chip with a bottom face of the concave portion;
    fluidizing a resin provided between the semiconductor chip and the wiring board;
    filling a lateral space proximate the semiconductor chip within the concave portion with the resin; and
    curing the resin;
    wherein the bonding tool has a protruding portion formed in the bottom face of the concave portion; and
    wherein the semiconductor chip is pressed with a protruding face of the protruding portion to thereby fill lateral spaces proximate the semiconductor chip and the protruding portion within the concave portion with the resin.

2. The method of manufacturing a semiconductor device of claim 1, wherein a surrounding portion of the concave portion of the bonding tool is kept out of contact with the wiring board.

3. The method of manufacturing a semiconductor device of claim 1, wherein the step of fluidizing the resin is carried out while the resin is heated.

4. The method of manufacturing a semiconductor device of claim 1, wherein the resin comprises a heat-hardening resin.

5. The method of manufacturing a semiconductor device of claim 1, wherein a sheet for preventing adhesion of the resin is interposed between the bonding tool and the resin.

6. The method of manufacturing a semiconductor device of claim 1, wherein the step of curing the resin is carried out with the bonding tool depressed.

* * * * *